(12) United States Patent
Tang et al.

(10) Patent No.: US 11,430,760 B2
(45) Date of Patent: Aug. 30, 2022

(54) CHIP PACKAGE DEVICE

(71) Applicant: HUAWEI TECHNOLOGIES CO., LTD., Guangdong (CN)

(72) Inventors: Jiajie Tang, Shanghai (CN); Guanhong Ye, Taiwan (CN); Laicun Lin, Shanghai (CN); Guowen Liu, Shanghai (CN); Shuai Zheng, Shenzhen (CN); Huafeng Zhang, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/931,819

(22) Filed: Jul. 17, 2020

(65) Prior Publication Data
US 2020/0350274 A1 Nov. 5, 2020

Related U.S. Application Data

(63) Continuation of application No. PCT/CN2019/071744, filed on Jan. 15, 2019.

(30) Foreign Application Priority Data

Jan. 19, 2018 (CN) .......................... 201810055269.8

(51) Int. Cl.
*H01L 23/00* (2006.01)
*H01L 23/31* (2006.01)
*H01L 23/498* (2006.01)

(52) U.S. Cl.
CPC .......... *H01L 24/73* (2013.01); *H01L 23/3107* (2013.01); *H01L 23/49811* (2013.01);
(Continued)

(58) Field of Classification Search
CPC ..................... H01L 24/16; H01L 24/32; H01L 2224/16225; H01L 24/73; H01L 23/3128;
(Continued)

(56) References Cited

U.S. PATENT DOCUMENTS 7,049,695 B1    5/2006  Pogge
9,343,437 B2 *  5/2016  Jang .................. H01L 23/49816
(Continued)

FOREIGN PATENT DOCUMENTS

CN    1828876 A       9/2006
CN    101060117 A    10/2007
(Continued)

OTHER PUBLICATIONS

European Search Report for Application No. EP 19 74 1747 dated Dec. 4, 2020.
(Continued)

*Primary Examiner* — Jasmine J Clark (57) ABSTRACT

A chip package device includes a chip, and a first substrate and a second substrate that are disposed opposite to each other, where the chip is disposed on a surface that is of the first substrate and that faces the second substrate. The chip is electrically connected to the first substrate through a first conductive part, the first substrate is electrically connected to the second substrate through a second conductive part, and a heat dissipation passage is formed between the chip and the second substrate through a thermally conductive layer. The chip package device may further include a molding compound that is configured to wrap the chip. The thermally conductive layer disposed between the chip and the second substrate can quickly dissipate a large amount of heat generated by the chip to the second substrate so that the chip maintains a normal temperature.

18 Claims, 3 Drawing Sheets

(52) U.S. Cl.
CPC ........ *H01L 23/49833* (2013.01); *H01L 24/16* (2013.01); *H01L 24/17* (2013.01); *H01L 2224/1601* (2013.01); *H01L 2224/16225* (2013.01); *H01L 2224/17519* (2013.01); *H01L 2224/73203* (2013.01); *H01L 2224/73253* (2013.01)

(58) Field of Classification Search
CPC ........... H01L 23/3107; H01L 23/49816; H01L 2224/73253; H01L 24/17
See application file for complete search history.

(56) References Cited

U.S. PATENT DOCUMENTS

| | | | |
|---|---|---|---|
| 10,002,857 B2* | 6/2018 | Solimando | .......... H01L 21/4882 |
| 2008/0291115 A1 | 11/2008 | Doan et al. | |
| 2012/0126396 A1 | 5/2012 | Zhao et al. | |
| 2013/0081796 A1 | 4/2013 | Horiuchi et al. | |
| 2014/0124955 A1* | 5/2014 | Chen | ................ H01L 23/49811 |
| 2014/0151880 A1 | 6/2014 | Kao et al. | |
| 2015/0084180 A1 | 3/2015 | Seko et al. | |
| 2017/0303431 A1 | 10/2017 | Kim | |
| 2018/0019183 A1 | 1/2018 | Wang et al. | |
| 2020/0105544 A1* | 4/2020 | Tsai | .................... H01L 23/5226 |

FOREIGN PATENT DOCUMENTS

| | | |
|---|---|---|
| CN | 104779175 A | 7/2015 |
| CN | 105762084 A | 7/2016 |
| CN | 106449551 A | 2/2017 |
| CN | 106684057 A | 5/2017 |
| WO | 2018095233 A1 | 5/2018 |

OTHER PUBLICATIONS

Chinese Office Action dated Mar. 9, 2021 for Application No. 201810055269.8, 6 pages.
Chinese Search Report dated Feb. 27, 2021 for Application No. 2018100552698, 3 pages.

* cited by examiner

CHIP PACKAGE DEVICE

CROSS-REFERENCE TO RELATED APPLICATION

This application is a continuation of International Application No. PCT/CN2019/071744, filed on Jan. 15, 2019, which claims priority to Chinese Patent Application No. 201810055269.8, filed on Jan. 19, 2018. The disclosures of the aforementioned applications are hereby incorporated by reference in their entireties.

TECHNICAL FIELD

The present invention relates to the field of electronic and communications technologies, and in particular, to a chip package device.

BACKGROUND

Figure 1:
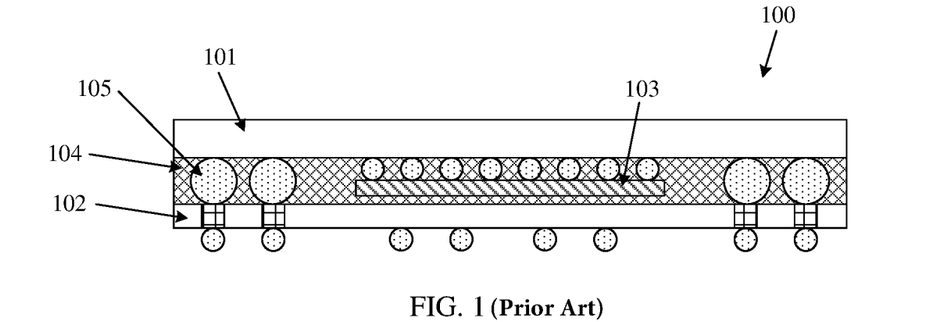
FIG. 1 shows a chip package device in the prior art.

As shown in FIG. 1, an existing chip package device 100 includes an upper-layer substrate 101 and a lower-layer substrate 102 that are disposed opposite to each other, and a chip 103 disposed on a surface that is of the upper-layer substrate 101 and that faces the lower-layer substrate 102. A molding compound 104 is filled between the upper-layer substrate 101 and the lower-layer substrate 102, to increase support strength of an entire package structure. The upper-layer substrate 101 and the lower-layer substrate 102 are electrically connected through an embedded ball grid array 105. As power of the chip 103 increases, the chip 103 generates more heat in a running process. When heat generated by the chip 103 accumulates and cannot be dissipated quickly, an internal temperature of the chip 103 becomes excessively high. This affects working performance and the lifespan of the chip 103.

SUMMARY

An objective of the present invention is to provide a chip package device with relatively high heat dissipation efficiency, to dissipate, through a thermally conductive layer at relatively high efficiency, heat generated by a chip.

According to a first aspect, an embodiment of the present invention provides a chip package device. The chip package device includes: a chip, a molding compound, a thermally conductive layer, and a first substrate and a second substrate that are disposed opposite to each other, where the chip is disposed on a surface that is of the first substrate and that faces the second substrate; and the chip is electrically connected to the first substrate through a first conductive part, and the second substrate is electrically connected to the first substrate through a second conductive part; the thermally conductive layer is disposed between the chip and the second substrate, and the thermally conductive layer is configured to form a heat dissipation passage between the chip and the second substrate; and the molding compound is configured to wrap the chip.

In an embodiment, the thermally conductive layer is a thermally conductive adhesive.

In an embodiment, the thermally conductive layer includes a first thermally conductive layer and a second thermally conductive layer, where the first thermally conductive layer is disposed on a surface that is of the chip and that faces the second substrate, and the second thermally conductive layer is disposed on a surface that is of the first thermally conductive layer and that faces the second substrate.

In an embodiment, the first thermally conductive layer is a metal layer, and the second thermally conductive layer is a thermally conductive adhesive.

In an embodiment, the first thermally conductive layer is a metal layer, and the second thermally conductive layer is solder paste.

In an embodiment, the first thermally conductive layer is a thermally conductive adhesive, the second thermally conductive layer comprises a plurality of metal columns, and the plurality of metal columns are distributed in a discrete array.

In an embodiment, a density of the metal columns that corresponds to an area in which the chip generates more heat is greater than a density of the metal columns that corresponds to an area in which the chip generates less heat.

In an embodiment, the molding compound is further configured to wrap the first thermally conductive layer and a portion that is of the second thermally conductive layer and that is close to the first thermally conductive layer.

In an embodiment, the thermally conductive layer includes a plurality of metal columns, and the plurality of metal columns are distributed in a discrete array.

In an embodiment, a density of the metal columns that corresponds to an area in which the chip generates more heat is greater than a density of the metal columns that corresponds to an area in which the chip generates less heat.

In an embodiment, the first conductive part includes a plurality of metal balls.

In an embodiment, the molding compound is further configured to wrap the plurality of metal balls.

In an embodiment, the first conductive part includes a plurality of metal balls and a plurality of metal columns, where the metal column is disposed on a surface that is of the chip and that faces the first substrate, and the metal ball is disposed at an end that is of the metal column and that is close to the first substrate and is configured to electrically connect the metal column to the first substrate.

In an embodiment, the molding compound is further configured to wrap the plurality of metal columns of the first conductive part.

In an embodiment, the second conductive part is a plurality of metal balls.

In an embodiment, the second conductive part comprises a plurality of metal columns.

In an embodiment, the molding compound is further configured to wrap a portion that is of the second conductive part and that is close to the first substrate.

In an embodiment, the second conductive part includes: a plurality of first metal balls, a plurality of metal columns, and a plurality of second metal balls, where the first metal ball is disposed on the surface that is of the first substrate and that faces the second substrate, the second metal ball is disposed on a surface that is of the second substrate and that faces the first substrate, and the metal column is disposed between the first metal ball and the second metal ball and is configured to electrically connect the first metal ball to the second metal ball.

In an embodiment, the molding compound is further configured to wrap portions that are of the plurality of metal columns of the second conductive part and that are close to the first substrate.

According to the chip package device provided in embodiments of the present invention, a heat dissipation passage between the chip and the second substrate is formed through the thermally conductive layer disposed between the chip and the second substrate, so that a large amount of heat generated by the chip in normal working can be dissipated to the second substrate through the thermally conductive layer, a normal working temperature of the chip is maintained, and a lifespan of the chip is extended.

BRIEF DESCRIPTION OF DRAWINGS

To describe the technical solutions in the embodiments of this application or in the prior art more clearly, the following briefly describes the accompanying drawings required for describing the embodiments or the prior art.

Descriptions of the reference numerals: 21: chip; 22: first substrate; 23: second substrate; 24: first conductive part; 25: second conductive part; 26: thermally conductive layer.

DESCRIPTION OF EMBODIMENTS

Figure 2:
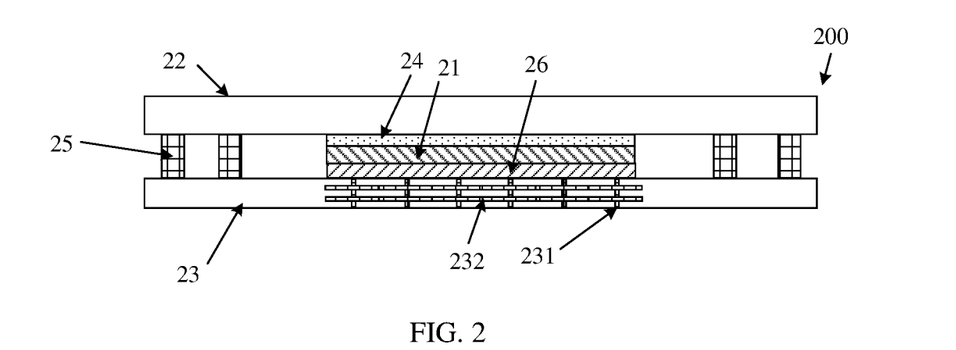
FIG. 2 shows a chip package device according to an embodiment of the present invention.

As shown in FIG. 2, an embodiment of the present invention provides a chip package device 200, where the chip package device 200 includes a chip 21, a thermally conductive layer 26, a molding compound, and a first substrate 22 and a second substrate 23 that are disposed opposite to each other. The chip 21 is disposed on a surface that is of the first substrate 22 and that faces the second substrate 23, and the chip 21 is electrically connected to the first substrate 22 through a first conductive part 24. The second substrate 23 is electrically connected to the first substrate 22 through a second conductive part 25. The thermally conductive layer 26 is disposed between the chip 21 and the second substrate 23, and the thermally conductive layer 26 is configured to dissipate, through the second substrate 23, heat generated by the chip 21. The molding compound is configured to wrap the chip 21.

In the foregoing embodiment of the present invention, the thermally conductive layer 26 is disposed between the chip 21 and the second substrate 23, to provide a heat dissipation passage between the chip 21 and the second substrate 23, to reduce a temperature of the chip 21 in normal working, thereby extending a lifespan of the chip 21, and maintaining working performance of the chip 21.

In addition, a plurality of metal thermally conductive lines 231 in a vertical direction and a plurality of metal thermally conductive lines 232 in a horizontal direction are disposed inside the second substrate 23. The metal thermally conductive lines 231 and the metal thermally conductive lines 232 may cross each other, to form a plurality of heat dissipation passages. When the heat generated by the chip 21 is transmitted to the second substrate 23 through the thermally conductive layer 26, the heat is transmitted to an external environment through a plurality of interconnected heat dissipation passages formed by the plurality of metal thermally conductive lines 231 and the plurality of metal thermally conductive lines 232, to avoid an excessively high temperature inside the second substrate 23 that affects heat dissipation.

The thermally conductive layer 26 may be a thermally conductive adhesive, and the thermally conductive adhesive generally has relatively high thermal conductivity. The heat generated by the chip 21 is transmitted to the second substrate 23 through the thermally conductive adhesive.

Figure 3:
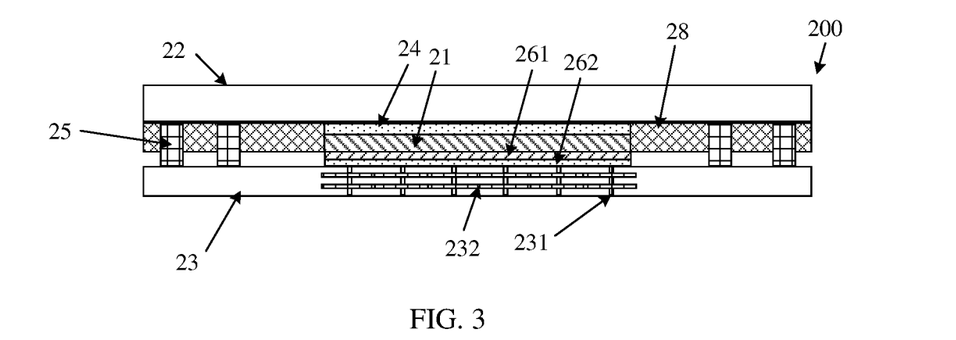
FIG. 3 shows another chip package device according to an embodiment of the present invention.

In the chip package device 200 shown in FIG. 3, in another implementation of the thermally conductive layer 26, the thermally conductive layer 26 may include a first thermally conductive layer 261 and a second thermally conductive layer 262 that covers a surface of one side of the first thermally conductive layer 261. The first thermally conductive layer 261 may be a metal layer, and is made of gold, silver, or another metal having relatively good thermal conductivity. The metal layer can conduct, at relatively high efficiency, the heat generated by the chip 21. The second thermally conductive layer 262 may be a thermally conductive adhesive, or solder paste with lower interface thermal resistance, to better dissipate heat and form a physical connection between the first thermally conductive layer 261 and the second substrate 23.

Figure 4:
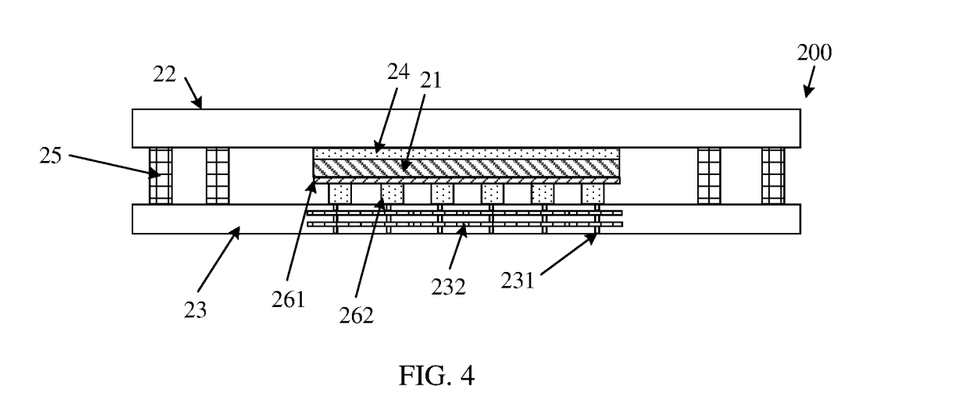
FIG. 4 shows still another chip package device according to an embodiment of the present invention.

In the chip package device 200 shown in FIG. 4, in another implementation of the first thermally conductive layer 261 and the second thermally conductive layer 262, the first thermally conductive layer 261 may be a thermally conductive adhesive, and the second thermally conductive layer 262 may include a plurality of metal columns, where the metal column may be made of copper, or another metal having relatively good thermal conductivity, for example, gold or silver. The metal column is physically connected to the second substrate 23 in a welding manner, and a heat conducting passage is established.

The plurality of metal columns in the second thermally conductive layer 262 may be distributed in a discrete array, for example, distributed in a rectangular array. The plurality of metal columns in the second thermally conductive layer 262 transmit, to the second substrate 23, heat dissipated by the first thermally conductive layer 261. The second thermally conductive layer 262 is disposed in a discrete array, so that a yield rate of welding the plurality of metal columns in the second thermally conductive layer 262 to the second substrate 23 is increased. In this way, thickness of the second thermally conductive layer 262 is more even, and areas are welded better, so that heat in the areas can be dissipated more quickly.

Figure 5:
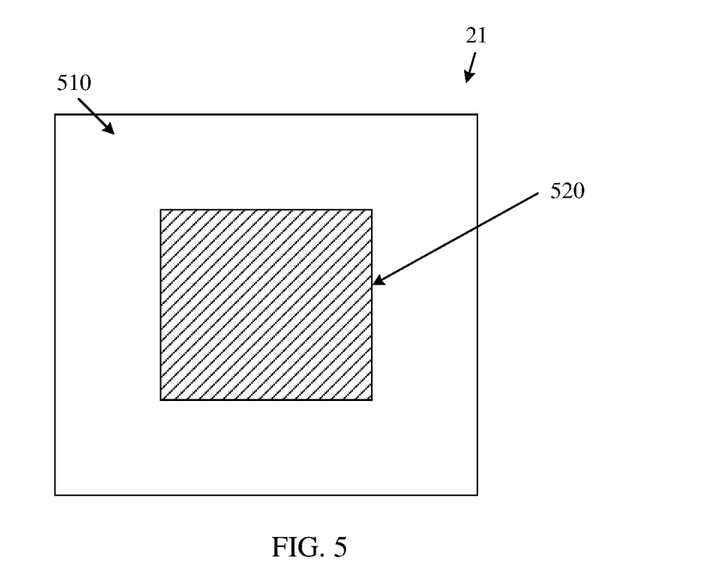
FIG. 5 is a heat distribution diagram of a chip according to an embodiment of the present invention.

When the chip 21 works normally, heat generated in different areas is not evenly distributed. FIG. 5 is a distribution diagram of heat generated by the chip 21 in normal working. In time periods with an equal length, an edge area 510 generates less heat, and a central area 520 generates more heat. Therefore, the plurality of metal columns in the second thermally conductive layer 262 may be distributed based on distribution of heat generated by a chip. For example, in an area (for example, the central area 520) in which the chip generates more heat, correspondingly, a distribution density of the plurality of metal columns in the second thermally conductive layer 262 is relatively high; and in an area (for example, the edge area 510) in which the chip generates less heat, correspondingly, a distribution density of the plurality of metal columns in the second thermally conductive layer 262 is relatively low. In this way, efficiency of dissipating heat of the chip 21 is further improved.

Figure 6:
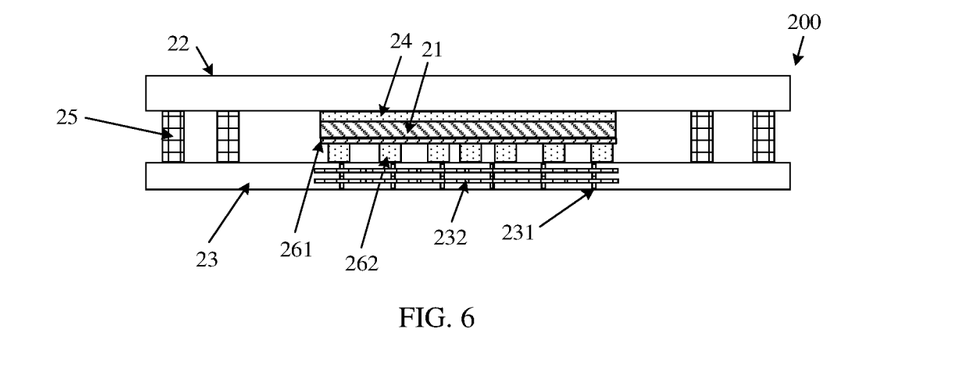
FIG. 6 shows yet another chip package device according to an embodiment of the present invention.

In the chip package device 200 shown in FIG. 6, in another implementation of the second thermally conductive layer 262, the plurality of metal columns in the second thermally conductive layer 262 may be distributed graphically, to transmit heat dissipated by the first thermally conductive layer 261 to the second substrate 23, where a density of the metal columns that corresponds to an area in which the chip generates more heat is greater than a density of the metal columns that corresponds to an area in which the chip generates less heat. Positions of the plurality of metal columns in the second thermally conductive layer 262 may be set according to the heat distribution diagram of the chip 21 shown in FIG. 5, where a distribution density of metal columns close to a central area of the chip 21 is relatively high, and a distribution density of metal columns far away from the center area of the chip 21 is relatively low. The metal columns with a relatively high distribution density may transmit, to the second substrate 23 at higher efficiency, heat generated by the chip 21, so that heat in a heat concentration area of the chip 21 can be better dissipated.

Figure 7:
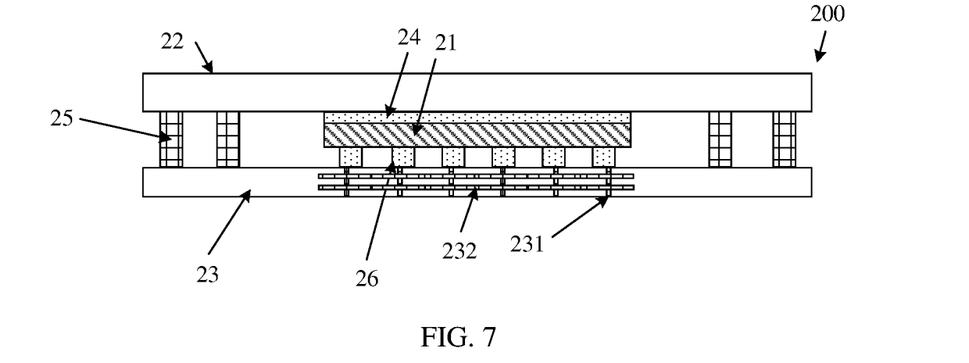
FIG. 7 shows still yet another chip package device according to an embodiment of the present invention.

In the chip package device 200 shown in FIG. 7, in another implementation of the thermally conductive layer 26, the thermally conductive layer 26 may further include a plurality of metal columns, to transmit, to the second substrate 23, heat dissipated by the chip 21. The plurality of metal columns in the thermally conductive layer 26 may be distributed in a discrete array, for example, distributed in a rectangular array, to improve a welding yield rate of the thermally conductive layer 26, and avoid problems of uneven thickness and poor welding of continuous thermally conductive layers in some areas, so that heat in an area can be dissipated quickly. One end that is of the plurality of metal columns in the thermally conductive layer 26 and that is in contact with the second substrate 23 is connected to the second substrate 23 through soldering tin, to provide better soldering strength. The plurality of metal columns in the thermally conductive layer 26 may alternatively be distributed graphically, to transmit heat, to the second substrate 23, dissipated by the thermally conductive layer 26, where a density of the metal columns that corresponds to an area in which the chip generates more heat is greater than a density of the metal columns that corresponds to an area in which the chip generates less heat. Positions of the plurality of metal columns in the thermally conductive layer 26 may be set according to the heat distribution diagram of the chip 21 shown in FIG. 5, where a distribution density of metal columns close to a central area of the chip 21 is relatively high, and a distribution density of metal columns far away from the center area of the chip 21 is relatively low. The metal columns with a relatively high distribution density may transmit, to the second substrate 23 at higher efficiency, heat generated by the chip 21, so that heat in a heat concentration area of the chip 21 can be better dissipated. In an embodiment of the chip package device 200, the first substrate 22 and the chip 21 may be electrically connected through a plurality of first conductive parts 24 connected between the chip 21 and the first substrate 22. In the chip package device 200 shown in FIG. 8, in an implementation of the first conductive part 24, the first conductive part 24 may be a plurality of metal balls. The metal balls may be disposed on a surface of the first substrate 22. A specific disposing manner may be as follows: The plurality of metal balls may be distributed in a discrete array, for example, distributed in a rectangular array, so that an electrical signal between the chip 21 and the first substrate 22 can be better conducted. The metal balls may each be a tin ball.

Figure 8:
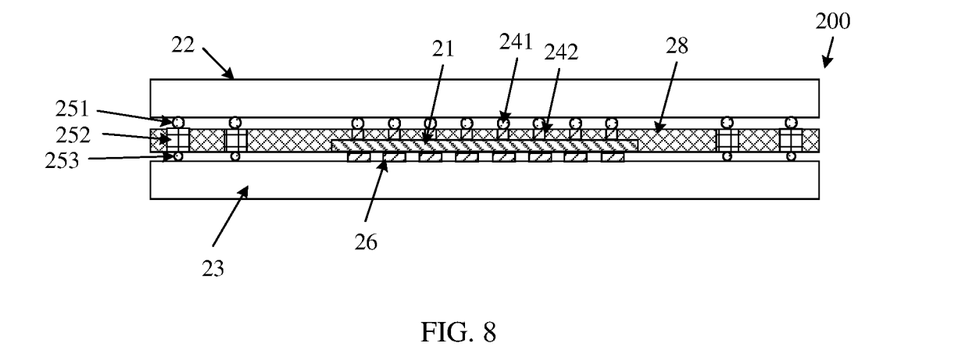
FIG. 8 shows a further chip package device according to an embodiment of the present invention.

In the chip package device 200 shown in FIG. 8, in another implementation of the first conductive part, the plurality of first conductive parts 24 include a plurality of metal balls 241 and a plurality of metal columns 242. One end of the metal column 242 is connected to the chip 21, and the other end of the metal column 242 is connected to the metal ball 241. The metal ball 241 is connected between the first substrate 22 and the metal column 242. Both the metal ball 241 and the metal column 242 are disposed on the surface of the first substrate 22. A specific disposing manner may be as follows: The plurality of metal balls 241 and the plurality of metal columns 242 may be distributed in a discrete array, for example, distributed in a rectangular array, so that an electrical signal between the chip 21 and the first substrate 22 can be better conducted. The metal balls 241 may each be a tin ball.

In an embodiment of the chip package device 200, the first substrate 22 and the second substrate 23 are electrically connected through a second conductive part 25. In an implementation of the second conductive part, the second conductive part 25 may be a metal ball, for example, a tin ball or another metal solder ball with high conductivity, to transmit an electrical signal on the first substrate 22 to the second substrate 23 through the second conductive part 25. In another implementation of the second conductive part 25, the second conductive part 25 may be a metal column, for example, a copper column or another metal column with high conductivity.

In the chip package device 200 shown in FIG. 8, in another implementation of the second conductive part 25, the second conductive part 25 may be a plurality of first metal balls 251, a plurality of metal columns 252, and a plurality of second metal balls 253. The first metal balls 251 are disposed on the surface that is of the first substrate 22 and that faces the second substrate 23, and the second metal balls 253 are disposed on a surface that is of the second substrate 23 and that faces the first substrate 22. One end of the metal column 252 is connected to the plurality of first metal balls 251, and the other end of the metal column 252 is connected to the second metal ball 253. The a plurality of first metal balls 251, the metal column 252, and the second metal ball 253 form an electrical connection passage between the first substrate 22 and the second substrate 23. The plurality of first metal balls 251 and the second metal ball 253 may be tin balls. The metal column 252 may be made of copper, or another metal with relatively good conductivity.

In the foregoing embodiment of the present invention, the chip package device 200 may further include a molding compound 28, and the molding compound 28 is disposed between the first substrate 22 and the second substrate 23.

In the chip package device 300 shown in FIG. 3, the molding compound 28 may be configured to wrap the chip 21, the first conductive part 24, and a portion that is of the second conductive part 25 and that is close to the first substrate 22. A surface that is of the chip 21 and that faces the second substrate 23 is not wrapped by the molding compound 28, and is configured to connect to the thermally conductive layer 26 to dissipate heat of the chip 21. A portion that is of the second conductive part 25 and that is close to the second substrate 23 is not wrapped by the molding compound 28.

Figure 9:
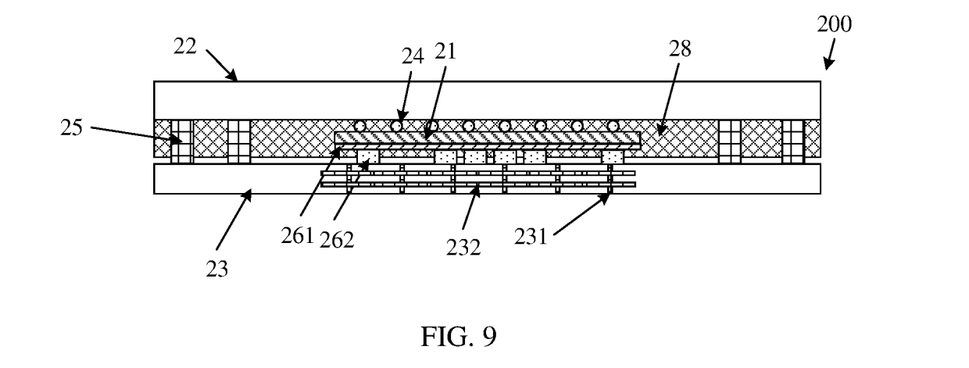
FIG. 9 shows a still further chip package device according to an embodiment of the present invention.

In the chip package device 200 shown in FIG. 9, in another implementation of the molding compound 28, the molding compound 28 may be further configured to wrap the chip 21, the first conductive part 24, a portion that is of the second conductive part 25 and that is close to the first substrate 22, the first thermally conductive layer 261, and a portion that is of the second thermally conductive layer 262 and that is close to the chip 21. A portion that is of the second conductive part 25 and that is close to the second substrate 23 is not wrapped by the molding compound 28. A portion that is of the second thermally conductive layer 262 and that is close to the second substrate 23 is not wrapped by the molding compound 28.

In the chip package device 200 shown in FIG. 8, in another implementation of the molding compound 28, the molding compound 28 may be further configured to wrap the chip 21, the metal column 242 of the first conductive part 24, and the metal column 252 of the second conductive part 25.

In the foregoing specific embodiments, the objectives, technical solutions, and beneficial effects of the present invention are described in further detail. In addition, the foregoing descriptions are merely specific embodiments of the present invention, but are not intended to limit the present invention. Any modification, equivalent replacement, or improvement made without departing from the spirit and principle of the present invention shall fall within the protection scope of the present invention.

What is claimed is:

1. A chip package device, comprising:
a chip;
a thermally conductive layer;
a first conductive part;
a second conductive part;
a first substrate and a second substrate that are disposed opposite to each other, wherein the chip is disposed on a surface that is of the first substrate and that faces the second substrate, the chip is electrically connected to the first substrate through the first conductive part, the second substrate is electrically connected to the first substrate through the second conductive part, and the thermally conductive layer is disposed between the chip and the second substrate; and
    a molding compound configured to wrap the chip, wherein the thermally conductive layer comprises:
    a first thermally conductive layer; and
    a second thermally conductive layer, wherein the first thermally conductive layer is disposed on a surface that is of the chip and that faces the second substrate, and the second thermally conductive layer is disposed on a surface that is of the first thermally conductive layer and that faces the second substrate.

2. The chip package device of claim 1, wherein the thermally conductive layer is a thermally conductive adhesive.

3. The chip package device of claim 1, wherein the first thermally conductive layer is a metal layer, and the second thermally conductive layer is a thermally conductive adhesive.

4. The chip package device of claim 1, wherein the first thermally conductive layer is a metal layer, and the second thermally conductive layer is solder paste.

5. The chip package device of claim 1, wherein the first thermally conductive layer is a thermally conductive adhesive, the second thermally conductive layer comprises a plurality of metal columns, and the plurality of metal columns are distributed in an array.

6. The chip package device of claim 1, wherein the molding compound is further configured to wrap the first thermally conductive layer and a portion that is of the second thermally conductive layer and that is close to the first thermally conductive layer.

7. A chip package device, comprising:
a chip;
a thermally conductive layer;
a first conductive part;
a second conductive part;
a first substrate and a second substrate that are disposed opposite to each other, wherein the chip is disposed on a surface that is of the first substrate and that faces the second substrate, the chip is electrically connected to the first substrate through the first conductive part, the second substrate is electrically connected to the first substrate through the second conductive part, and the thermally conductive layer is disposed between the chip and the second substrate; and
    a molding compound configured to wrap the chip, wherein the thermally conductive layer comprises a plurality of metal columns, and the plurality of metal columns are distributed in an array.

8. A chip package device, comprising:
a chip;
a thermally conductive layer;
a first conductive part;
a second conductive part;
a first substrate and a second substrate that are disposed opposite to each other, wherein the chip is disposed on a surface that is of the first substrate and that faces the second substrate, the chip is electrically connected to the first substrate through the first conductive part, the second substrate is electrically connected to the first substrate through the second conductive part, and the thermally conductive layer is disposed between the chip and the second substrate; and
    a molding compound configured to wrap the chip, wherein the first conductive part comprises:
    a plurality of metal balls; and
    a plurality of metal columns, wherein the plurality of metal columns are disposed on a surface that is of the chip and that faces the first substrate, the plurality of metal balls are disposed at an end that is of the plurality of metal columns and that is close to the first substrate and are configured to electrically connect the metal column to the first substrate, and the molding compound is further configured to wrap the plurality of metal columns.

9. A chip package device, comprising:
a chip;
a thermally conductive layer;
a first conductive part;
a second conductive part;
a first substrate and a second substrate that are disposed opposite to each other, wherein the chip is disposed on a surface that is of the first substrate and that faces the second substrate, the chip is electrically connected to the first substrate through the first conductive part, the second substrate is electrically connected to the first substrate through the second conductive part, and the thermally conductive layer is disposed between the chip and the second substrate; and
    a molding compound configured to wrap the chip, wherein the second conductive part comprises a plurality of metal columns, and wherein the molding compound is further configured to wrap a portion that is of the plurality of metal columns and that is close to the first substrate.

10. A chip package device, comprising:
a chip;
a thermally conductive layer;
a first conductive part;
a second conductive part;
a first substrate and a second substrate that are disposed opposite to each other, wherein the chip is disposed on a surface that is of the first substrate and that faces the second substrate, the chip is electrically connected to the first substrate through the first conductive part, the second substrate is electrically connected to the first substrate through the second conductive part, and the thermally conductive layer is disposed between the chip and the second substrate; and
a molding compound configured to wrap the chip, wherein the second conductive part comprises:
a plurality of first metal balls, a plurality of metal columns, and a plurality of second metal balls, wherein the plurality of first metal balls are disposed on the surface that is of the first substrate and that faces the second substrate, the plurality of second metal balls are disposed on a surface that is of the second substrate and that faces the first substrate, and the plurality of metal columns is disposed between the plurality of first metal balls and the plurality of second metal balls and are configured to electrically connect the plurality of first metal balls to the plurality of second metal balls, and the molding compound is further configured to wrap portions that are of the plurality of metal columns of the second conductive part and that are close to the first substrate.

11. A chip package device, comprising:
a first substrate;
a chip;
a thermally conductive layer;
a first conductive part;
a second conductive part, wherein the chip, the thermally conductive layer, the first conductive part and the second conductive part are disposed on the same side of the first substrate, the chip is electrically connected to the first substrate through the first conductive part, a second substrate is electrically connected to the first substrate through the second conductive part, and the thermally conductive layer is disposed between the chip and the second substrate; and
a molding compound configured to wrap the chip, wherein the thermally conductive layer comprises:
a first thermally conductive layer; and
a second thermally conductive layer, wherein the first thermally conductive layer is disposed on a surface that is of the chip and that faces the second substrate, and the second thermally conductive layer is disposed on a surface that is of the first thermally conductive layer and that faces the second substrate.

12. The chip package device of claim 11, wherein the first thermally conductive layer is a thermally conductive adhesive, and the second thermally conductive layer comprises a plurality of metal columns distributed in an array.

13. The chip package device of claim 11, wherein the molding compound is further configured to wrap the first thermally conductive layer and a portion that is of the second thermally conductive layer and that is close to the first thermally conductive layer.

14. A chip package device, comprising:
a first substrate;
a chip;
a thermally conductive layer;
a first conductive part;
a second conductive part, wherein the chip, the thermally conductive layer, the first conductive part and the second conductive part are disposed on the same side of the first substrate, the chip is electrically connected to the first substrate through the first conductive part, a second substrate is electrically connected to the first substrate through the second conductive part, and the thermally conductive layer is disposed between the chip and the second substrate; and
a molding compound configured to wrap the chip, wherein the first conductive part comprises:
a plurality of metal balls; and
a plurality of metal columns, wherein the plurality of metal columns are disposed on a surface that are of the chip and that faces the first substrate, the plurality of metal balls are disposed at an end that is of the plurality of metal columns and that is close to the first substrate and are configured to electrically connect the plurality of metal columns to the first substrate, and the molding compound is further configured to wrap the plurality of metal columns.

15. The chip package device of claim 14, wherein the second conductive part comprises a plurality of metal columns, and wherein the molding compound is further configured to wrap a portion that is of the plurality of metal columns and that is close to the first substrate.

16. A chip package device, comprising:
a first substrate;
a chip;
a thermally conductive layer;
a first conductive part;
a second conductive part, wherein the chip, the thermally conductive layer, the first conductive part and the second conductive part are disposed on the same side of the first substrate, the chip is electrically connected to the first substrate through the first conductive part, a second substrate is electrically connected to the first substrate through the second conductive part, and the thermally conductive layer is disposed between the chip and the second substrate; and
a molding compound configured to wrap the chip, wherein the second conductive part comprises:
a plurality of first metal balls;
a plurality of metal columns; and
a plurality of second metal balls, wherein the plurality of first metal balls are disposed on the surface that are of the first substrate and that face the second substrate, the plurality of second metal balls are disposed on a surface that are of the second substrate and that face the first substrate, and the plurality of metal columns are disposed between the plurality of first metal balls and the plurality of second metal balls and are configured to electrically connect the plurality of first metal balls to the plurality of second metal balls, and the molding compound is further configured to wrap portions that are of the plurality of metal columns of the second conductive part and that are close to the first substrate.

17. A chip package device, comprising:
a first substrate;
a chip;
a thermally conductive layer;
a first conductive part;
a second conductive part, wherein the chip, the thermally conductive layer, the first conductive part and the second conductive part are disposed on the same side of the first substrate, the chip is electrically connected to the first substrate through the first conductive part, a second substrate is electrically connected to the first substrate through the second conductive part, and the thermally conductive layer is disposed between the chip and the second substrate; and a molding compound configured to wrap the chip, wherein the thermally conductive layer comprises:

a first thermally conductive layer; and a second thermally conductive layer, wherein the first thermally conductive layer is disposed on a surface that is of the chip and that faces the second substrate, and the second thermally conductive layer is disposed on a surface that is of the first thermally conductive layer and that faces the second substrate, and wherein the first thermally conductive layer is a metal layer, and the second thermally conductive layer is a thermally conductive adhesive.

18. A chip package device, comprising:

a first substrate;

a chip;

a thermally conductive layer;

a first conductive part;

a second conductive part, wherein the chip, the thermally conductive layer, the first conductive part and the second conductive part are disposed on the same side of the first substrate, the chip is electrically connected to the first substrate through the first conductive part, a second substrate is electrically connected to the first substrate through the second conductive part, and the thermally conductive layer is disposed between the chip and the second substrate; and a molding compound configured to wrap the chip, wherein the thermally conductive layer comprises:

a first thermally conductive layer; and a second thermally conductive layer, wherein the first thermally conductive layer is disposed on a surface that is of the chip and that faces the second substrate, and the second thermally conductive layer is disposed on a surface that is of the first thermally conductive layer and that faces the second substrate, and wherein the first thermally conductive layer is a metal layer, and the second thermally conductive layer is solder paste.

* * * * *